United States Patent
Ayotte et al.

(10) Patent No.: US 8,765,593 B2
(45) Date of Patent: Jul. 1, 2014

(54) CONTROLLED COLLAPSE CHIP CONNECTION (C4) STRUCTURE AND METHODS OF FORMING

(75) Inventors: Stephen P. Ayotte, Briston, VT (US); Timothy H. Daubenspeck, Colchester, VT (US); David J. Hill, Richmond, VT (US); Glen E. Richard, Essex Junction, VT (US); Timothy M. Sullivan, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 13/569,674

(22) Filed: Aug. 8, 2012

(65) Prior Publication Data

US 2014/0042630 A1  Feb. 13, 2014

(51) Int. Cl.
  *H01L 21/44* (2006.01)
(52) U.S. Cl.
  USPC ............ 438/613; 438/612; 257/E21.508
(58) Field of Classification Search
  USPC .................. 438/613; 257/E21.508
  See application file for complete search history.

(56) References Cited

U.S. PATENT DOCUMENTS

| | | | |
|---|---|---|---|
| 6,415,974 B2 | 7/2002 | Jao | |
| 6,661,098 B2 | 12/2003 | Magerlein et al. | |
| 7,682,961 B2 | 3/2010 | Daubenspeck et al. | |
| 8,003,512 B2 | 8/2011 | Belanger et al. | |
| 8,093,097 B2 | 1/2012 | Lange et al. | |
| 2003/0013290 A1 | 1/2003 | Greer | |
| 2007/0105359 A1* | 5/2007 | Daubenspeck et al. | ....... 438/612 |
| 2008/0142968 A1 | 6/2008 | Jadhav et al. | |
| 2009/0130599 A1* | 5/2009 | Daubenspeck et al. | ....... 430/312 |
| 2010/0032835 A1 | 2/2010 | Daubenspeck et al. | |
| 2011/0006422 A1 | 1/2011 | Daubenspeck et al. | |
| 2011/0063815 A1 | 3/2011 | Lu et al. | |

FOREIGN PATENT DOCUMENTS

JP  4359465 A  12/1992

* cited by examiner

*Primary Examiner* — Daniel Whalen
(74) *Attorney, Agent, or Firm* — David A. Cain; Hoffman Warnick LLC (57) ABSTRACT

Aspects of the present invention relate to a controlled collapse chip connection (C4) structures. Various embodiments include a method of forming a controlled collapse chip connection (C4) structure. The method can include: providing a precursor structure including: a substrate, a dielectric over the substrate, the dielectric including a plurality of trenches exposing a portion of the substrate, and a metal layer over the dielectric and the portion of the substrate in each of the plurality of trenches, forming a resist layer over the metal layer, forming a rigid liner over a surface of the resist layer and the metal layer, and forming solder over the rigid liner between portions of the resist layer.

13 Claims, 7 Drawing Sheets

CONTROLLED COLLAPSE CHIP CONNECTION (C4) STRUCTURE AND METHODS OF FORMING

BACKGROUND

1. Technical Field

The subject matter disclosed herein relates generally to semiconductor structures. Specifically, the subject matter disclosed herein relates to a controlled collapse chip connection (C4) and a method for forming.

2. Related Art

Controlled collapse chip connections (C4) are used to form a physical and electrical connection between semiconductor die and semiconductor packages. In conventional C4, solder is placed on a conductive pad in electrical connection with the integrated circuit (IC) of the semiconductor die, before heating the semiconductor die to bond the solder to the pad. Once heated, or "reflowed," the solder forms a spherical shape due to the surface tension of the solder. In conventional C4 structures, spherical solder deposits are referred to as "solder bumps." After the solder bumps are formed, the semiconductor die containing the solder bumps are bonded to the semiconductor package to complete the semiconductor device.

In forming conventional C4, the solder bumps should be uniform in shape (e.g., height, diameter). However, during the reflow process, the shape of the solder bumps often becomes inconsistent, resulting in conductivity issues between the semiconductor die and package. For example, when the heights of the solder bumps are inconsistent, the shorter solder bumps of the die may not create a complete physical or electrical connection with the package. Modifying defective solder bumps by removing or adding solder causes a change in the diameter and density of the defective solder bump, and often does not solve conductivity issues. Conventionally, defective solder bumps are identified and replaced as a whole. Replacing the defective solder bumps creates increased costs and manufacturing time when creating semiconductor devices.

Additionally, conventional C4 typically arrange the solder bumps in limited geometric configurations. More specifically, conventional C4 is arranged by a predetermined set of columns and rows. As a result of the semiconductor die having a limited contact configuration of the solder bumps, the contact configuration of the semiconductor package is also limited. These limitations in the contact configurations of the solder bumps make designing contact configurations for complex circuitry and/or complex semiconductors both difficult and time intensive.

BRIEF SUMMARY

Controlled collapse chip connection (C4) structures and methods of forming are disclosed. Various embodiments include a method of forming a controlled collapse chip connection (C4) structure. The method can include: providing a precursor structure including: a substrate; a dielectric over the substrate, the dielectric including a plurality of trenches exposing a portion of the substrate; and a metal layer over the dielectric and the portion of the substrate in each of the plurality of trenches; forming a resist layer over the metal layer; forming a rigid liner over a surface of the resist layer and the metal layer; and forming solder over the rigid liner between portions of the resist layer.

A first aspect of the invention includes a method of forming a controlled collapse chip connection (C4) structure. The method includes: providing a precursor structure including: a substrate; a dielectric over the substrate, the dielectric including a plurality of trenches exposing a portion of the substrate; and a metal layer over the dielectric and the portion of the substrate in each of the plurality of trenches; forming a resist layer over the metal layer; forming a rigid liner over a surface of the resist layer and the metal layer; and forming solder over the rigid liner between portions of the resist layer.

A second aspect of the invention includes a controlled collapse chip connection (C4) structure having: a substrate; a dielectric over the substrate, the dielectric including a plurality of trenches exposing a portion of the substrate; a metal layer over the dielectric and the portion of the substrate in each of the plurality of trenches; a plurality of rigid liners over the metal layer within the trenches and a portion of the metal layer over the dielectric; and a solder element formed within each of the plurality of rigid liners.

A third aspect of the invention includes a method of forming a controlled collapse chip connection (C4) structure. The method includes: providing a precursor structure including: a substrate; a dielectric over the substrate, the dielectric including a plurality of trenches exposing a portion of the substrate; and a metal layer over the dielectric and the portion of the substrate in the plurality of trenches; forming a resist layer over the metal layer; etching a plurality of openings in the resist layer, the plurality of openings aligned with the plurality of trenches; forming a rigid liner within the plurality of openings in the resist layer; and depositing a solder over the rigid liner formed within the plurality of openings in the resist layer.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As described herein, aspects of the invention relate to a controlled collapse chip connection (C4) and method of forming. Specifically, as described herein, aspects of the invention relate to a C4 structure and method of forming a C4 structure by utilizing a rigid liner to provide a mold for electrically connective solder material.

Figure 1:
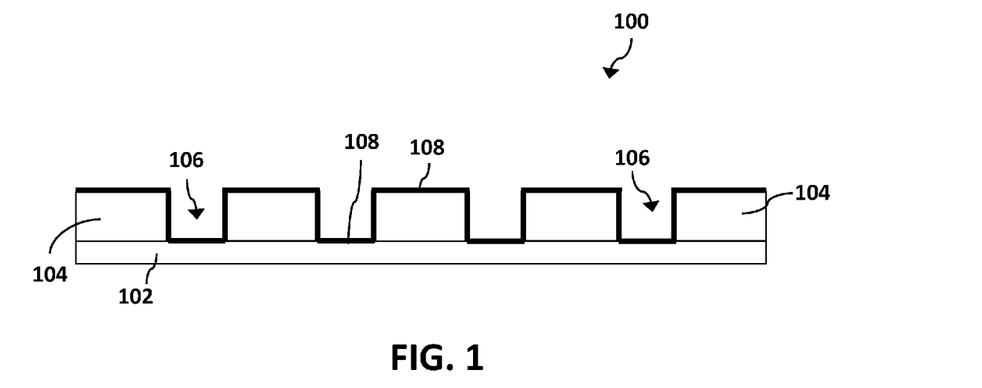
FIGS. 1-7 depict cross-sectional views of a controlled collapse chip connection (C4) structure undergoing processes according to various embodiments of the invention.

Turning to FIGS. 1-8, depictions of cross-sectional views of a C4 structure undergoing processes according to various embodiments of the invention are provided. In an embodiment, as shown in FIG. 1, a precursor structure 100 is provided. Precursor structure 100 may include a substrate 102. Substrate 102 may include an active layer of a semiconductor die or integrated circuit (IC) in which C4 structure may be formed. Substrate 102 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

In an embodiment, as shown in FIG. 1, precursor structure 100 may also include a dielectric 104 over substrate 102. More specifically, dielectric 104 may be disposed over substrate 102, and may include a plurality of trenches 106 which may expose a portion of substrate 102. In an embodiment, dielectric 104 may include any conventional dielectric material, and more specifically may include a combination of a hard dielectric material and an organic polymer buffer layer. The hard dielectric material of dielectric layer 104 may include, for example, silicon oxide ($SiO_2$), silicon nitride ($Si_3N_4$), or a combination of the two, such that the silicon nitride is disposed over the silicon oxide. The organic polymer buffer layer of dielectric layer 104 may include, for example, a polyimide material or a photosensitive polyimide (PSPI) material. Dielectric 104, including the plurality of trenches 106, may be formed over substrate 102 using any conventional deposition technique described herein and/or known in the art. For example, deposition techniques or the term "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

In an embodiment, as shown in FIG. 1, precursor structure 100 may also include a metal layer 108 over the dielectric 104 and the exposed portion of substrate 102 in each of the plurality of trenches 106. More specifically, metal layer 108 may be deposited over dielectric 104, including the sidewalls of each of the plurality of trenches 106 and the exposed portion of substrate 102. Metal layer 108 may be formed by any conventional deposition techniques described herein and/or known in the art. In an embodiment, as shown in FIG. 1, metal layer 108 may provide the C4 structure with under bump metallization (UBM), and more specifically, may provide a conductive layer between substrate 102 and conductive material formed over metal layer 108, as discussed below. Metal layer 108 may include, for example, titanium tungsten (TiW), copper (Cu), or chromium-copper (Cr—Cu). It is understood that metal layer 108 may not be limited to a single layer of material. That is, metal layer 108 may include a plurality of layers disposed over dielectric 104, the exposed portion of substrate 102, and one another, respectively, for providing conductive layers between substrate 102 and conductive material formed over metal layer 108.

Figure 2:
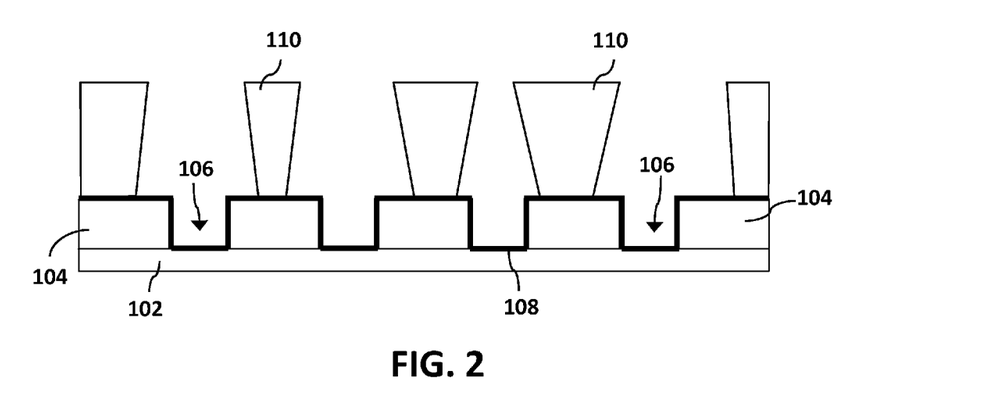

FIG. 2 depicts another process according to embodiments of the invention, the process including forming a resist layer 110 over metal layer 108. More specifically, forming resist layer 110 may include selectively forming resist layer 110 over only a portion of metal layer 108 overlying dielectric 104, exclusive of metal layer 108 in the plurality of trenches 106. In an alternative embodiment, resist layer 110 may be formed by blanket depositing resist layer 110 over metal layer 108 overlying dielectric layer 104, then masking resist layer 110 to expose a portion of resist layer 110, and finally removing the exposed portions of resist layer 110. In further alternative embodiments, resist layer 110 can be formed by any conventional deposition techniques described herein and/or known in the art.

Figure 3:
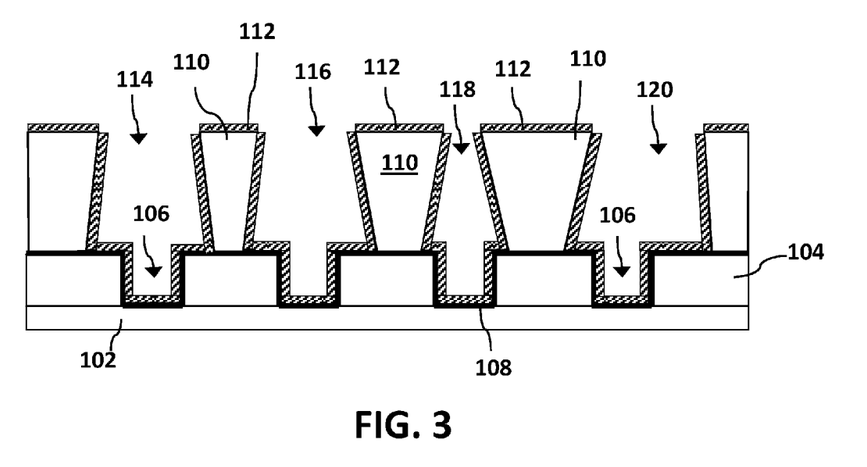

FIG. 3 depicts another process according to embodiments of the invention, the process including forming a rigid liner 112 over resist layer 110 and metal layer 108. More specifically, rigid liner 112 may be formed over resist layer 100 and metal layer 108 within the plurality of trenches 106. As shown in FIG. 3, rigid liner 112 may be formed over metal layer 108 formed over the sidewalls of each of the plurality of trenches 106 of dielectric 104. Rigid liner 120 may include, for example, nickel (Ni), tungsten (W), titanium tungsten (TiW), or tantalum nitride (TaN).

In an embodiment, as shown in FIG. 3, forming rigid liner 112 over resist layer 110 and metal layer 108 may also include forming a plurality of openings 114-120. More specifically, the plurality of openings 114-120 may be formed within portions of rigid liner 112 between portions of resist layer 110, and may be aligned with the plurality of trenches 106 formed in dielectric 104. As shown in FIG. 3, each of the plurality of openings 114-120 may include a distinct shape. Opening 114 and opening 116 may be substantially similar in shape (e.g., width, height, volume, etc.) to one another, and may be distinct from opening 118 and opening 120, respectively. As shown in FIG. 3, openings 114 and 118 may be substantially symmetrical openings formed within rigid liner 112, between portions of resist layer 110; however, opening 114 may be larger in shape than opening 118. Also shown in FIG. 3, opening 120 may be substantially offset or a substantially asymmetrical opening formed between portions of resist layer 110. In an alternative embodiment, the plurality of openings 114-120 formed within rigid liner 112 between portions of resist layer 110 may be substantially similar in shape.

Figure 4:
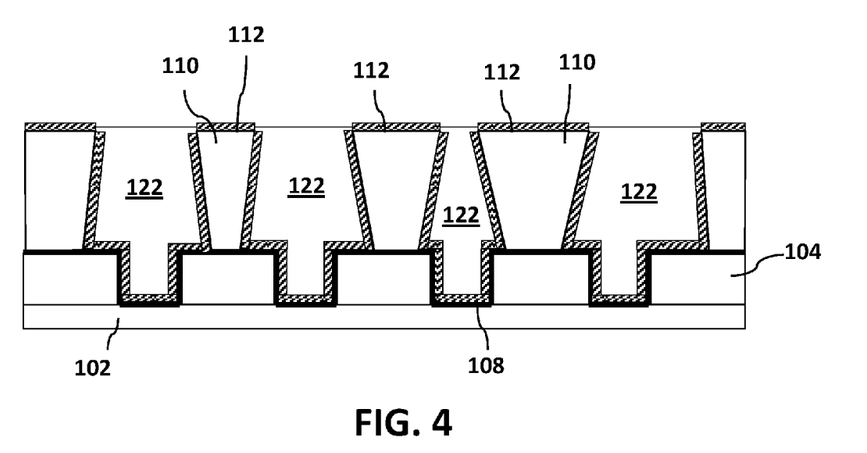

FIG. 4 depicts another process according to embodiments of the invention, the process including forming a solder element 122 over rigid liner 112 between portions of resist layer 110. More specifically, as shown in FIG. 4, solder element 122 is formed within each of the plurality of openings 114-120 formed within portions of rigid liner 112 between portions of resist layer 110. Rigid liner 112 may act as a mold or casing for solder element 122 formed over rigid liner 112. Solder element 122 may include any conventional conductive material used in C4 structures, such as, but not limited to, nickel (Ni), copper (Cu), and lead (Pb).

Figure 5:
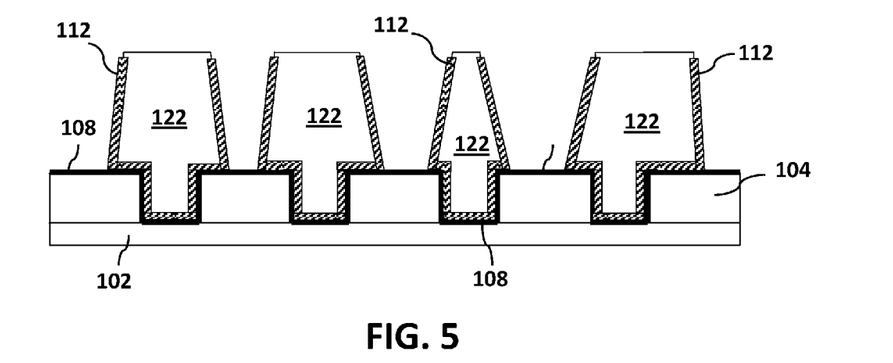

FIG. 5 depicts another process according to embodiments of the invention, the process including removing resist layer 110 and a portion of rigid liner 112 positioned between rigid liner 112 including solder element 122. More specifically, resist layer 110 and the portion of rigid liner 112 over the top surface of resist layer 110 may be removed. As a result, a portion of metal layer 108, exclusive of metal layer 108 within the plurality of trenches 106, is exposed and may be positioned between rigid liner 112 including solder element 122. Resist layer 110 and the portion of rigid liner 112 may be removed from the C4 structure by a stripping process in order to expose a portion of metal layer 108. In an alternative embodiment, resist layer 110 and the portion of rigid liner 112 may be removed from the C4 structure using any conventional removal technique described herein and/or known in the art.

Figure 6:
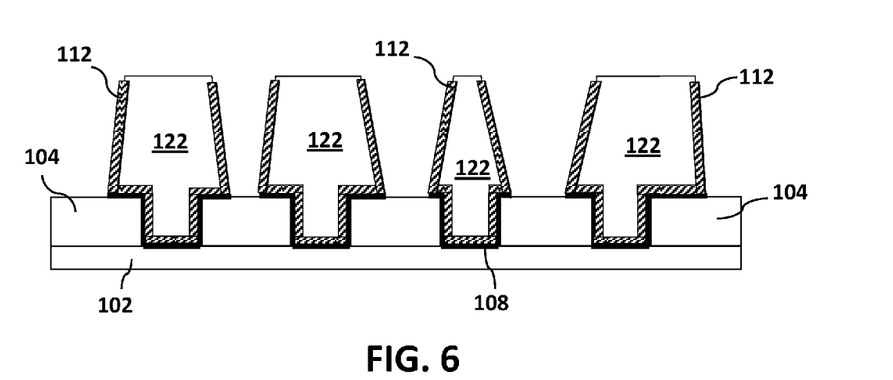

FIG. 6 depicts another process according to embodiments of the invention, the process including removing metal layer 108 over the surface of dielectric 104 between rigid liner 112 including solder element 122. More specifically, a portion of the exposed metal layer 108 disposed over dielectric 104 may be removed using a wet etching removal process. In an alternative embodiment, the exposed portion of metal layer 108 may be removed from the C4 structure using any conventional removal technique described herein and/or known in the art.

Figure 7:
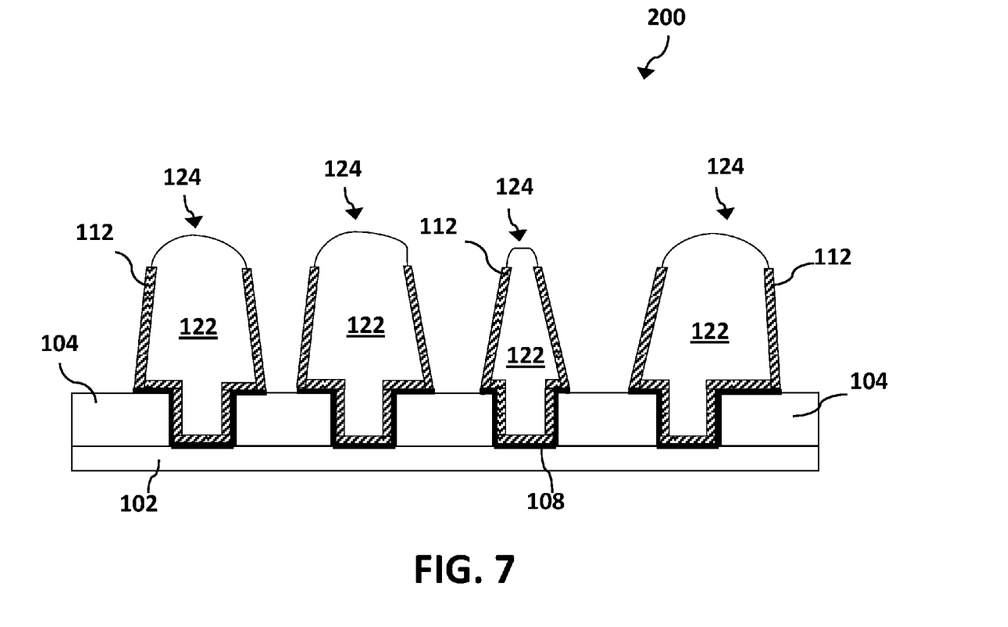

FIG. 7 depicts another process according to embodiments of the invention, the process including reflowing (e.g., heating) solder element 122 within rigid liner 112 previously formed between resist layer 110. More specifically, as shown in FIG. 7, C4 structure 200, formed by the processes described above, may be heated by any conventional means, and solder element 122 may expand and/or flow over the top of rigid liner 112. The heating or reflow process may result in forming a convex contact tip 124 of solder element 122 for providing pad contact with the semiconductor package (not shown). During the reflowing of solder element 122, the shape of rigid liner 112 is substantially unaffected by the heat that may expand solder element 122. That is, rigid liner 112 has a melting temperature greater than a melting temperature of solder element 122. As a result of rigid liner 112 having a higher melting temperature, rigid liner 112 may act as a mold or casing for solder element 122 during reflow, which may allow solder element 122 to form contact tips 124 without substantially deviating from the unique shapes formed by rigid liner 112. Once contact tips 124 are formed on solder element 122, C4 structure 200, as shown in FIG. 7, may be bonded to semiconductor package.

Figure 8:
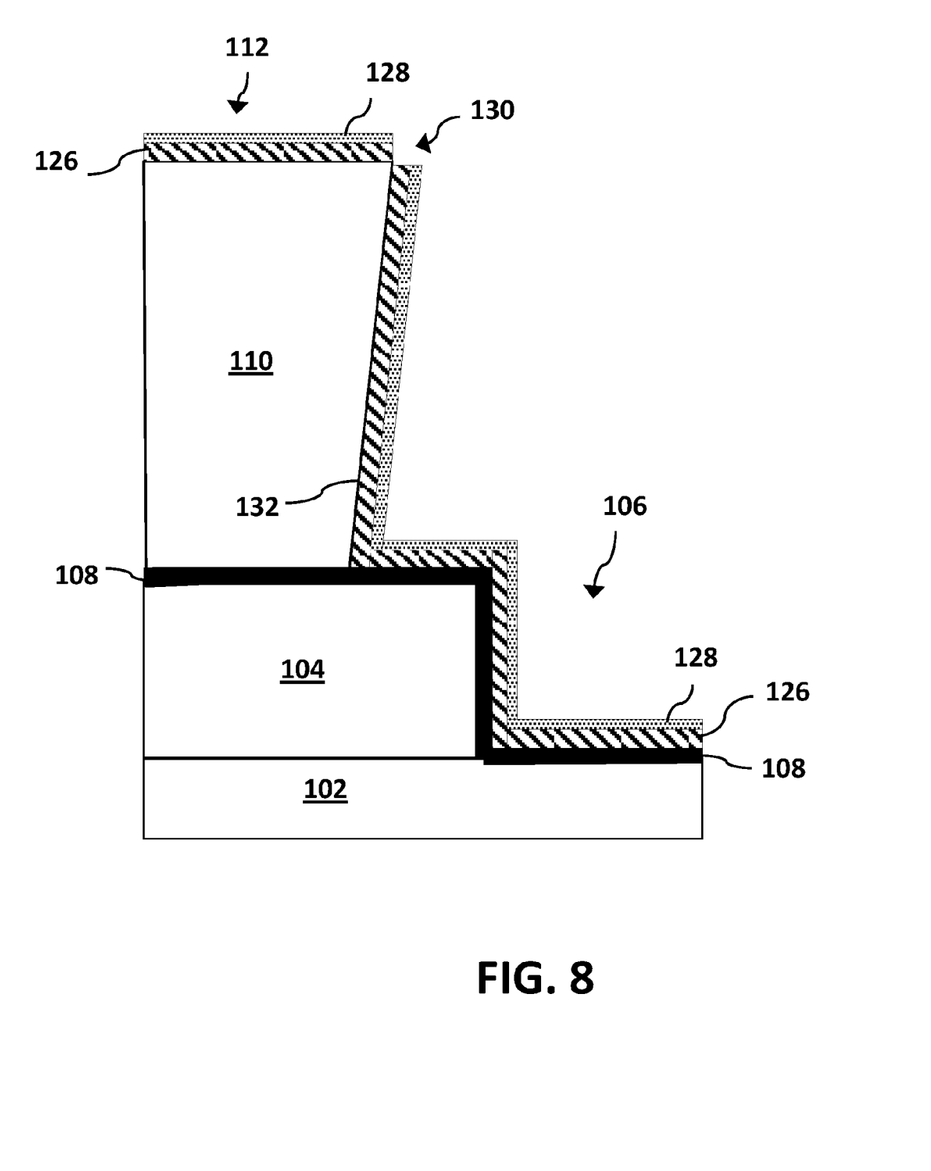
FIG. 8 depicts a cross-sectional view of a portion of a C4 structure according to various embodiments of the invention.

Turning to FIG. 8, depictions of a cross-sectional view of a portion of the C4 structure 200 according to various embodiments of the invention is provided. In the Figures, it is understood that similarly numbered components may function in a substantially similar fashion. Redundant explanation of these components has been omitted for clarity. In an embodiment, as shown in FIG. 8, rigid liner 112 may include two distinct layers. More specifically, forming rigid liner 112 may include depositing a dry film adhesive resist layer 126 over resist layer 110 and metal layer 108, and then depositing an outer liner layer 128 over dry film adhesive resist layer 126 using plasma vapor deposition. Outer liner layer 128 may include, for example, titanium tungsten (TiW) or tantalum nitride (TaN) and nickel (Ni). That is, outer liner layer 128 may include a material which may not be substantially soluble in solder element 122 during the reflow process. The depositing of dry film adhesive resist layer 126 may be accomplished by any conventional deposition techniques described herein and/or known in the art.

As shown in FIG. 8, rigid liner 112 may also include a void 130 positioned substantially a top surface edge of the portions of resist layer 110. Void 130 in rigid liner 112 may be a result of the negative angle formed in resist layer 110. More specifically, a discontinuity (e.g., void 130) may naturally be formed in rigid liner 112 during the depositing process (e.g., physical vapor deposition sputtering) of rigid liner 112 over the non-vertical, or negatively angled sidewalls 132 of resist layer 110. As discussed above with respect to FIG. 5, resist layer 110 and a portion of rigid liner 112 positioned between rigid liner 112 including solder element 122 may be removed using a stripping process. More specifically, a stripper element (not shown) may enter void 130 in rigid liner 112 to gain access to resist layer 110 and may begin stripping or removing resist layer 110 from C4 structure 200. As a result of the stripper element being able to access resist layer 110 via void 130 of rigid liner 112, the portion of rigid liner 112 over the top surface of resist layer 110 may be removed from C4 structure 200 without requiring direct contact with the stripper element (e.g., rigid liner 112 may be washed away with the stripped resist layer 110). This process of stripping resist layer 110 may further prevent degradation of rigid liner 112 including solder element 122 during the removal process of resist layer 110 and a portion of rigid liner 112 positioned between rigid liner 112 including solder element 122.

In an embodiment, as shown in FIG. 8, C4 structure 200 may include substrate 102, and dielectric 104 over substrate 102. As shown in FIG. 8, dielectric 104 may include plurality of trenches 106 exposing a portion of substrate 102. C4 structure 200 may also include a metal layer 108 over dielectric 104 and the portion of exposed substrate 102 in each of the plurality of trenches 106. Also shown in FIG. 8, C4 structure 200 may include a plurality of rigid liners 112 over metal layer 108 within trenches 106 and a portion of metal layer 108 over dielectric 104. C4 structure 200, as shown in FIG. 8, also includes solder element 122 formed within each of the plurality of rigid liners 112. Rigid liner 112 of C4 structure 200 is distinct from the prior art, as such a liner is not used by conventional C4s of the prior art. That is, as discussed above, solder material (e.g., solder element 122) used in prior art is placed on a contact pad, and is not constrained by any additional mold or structure during the reflow process of the conventional C4. This results in inconsistently shaped solder bumps in conventional C4.

Figure 9:
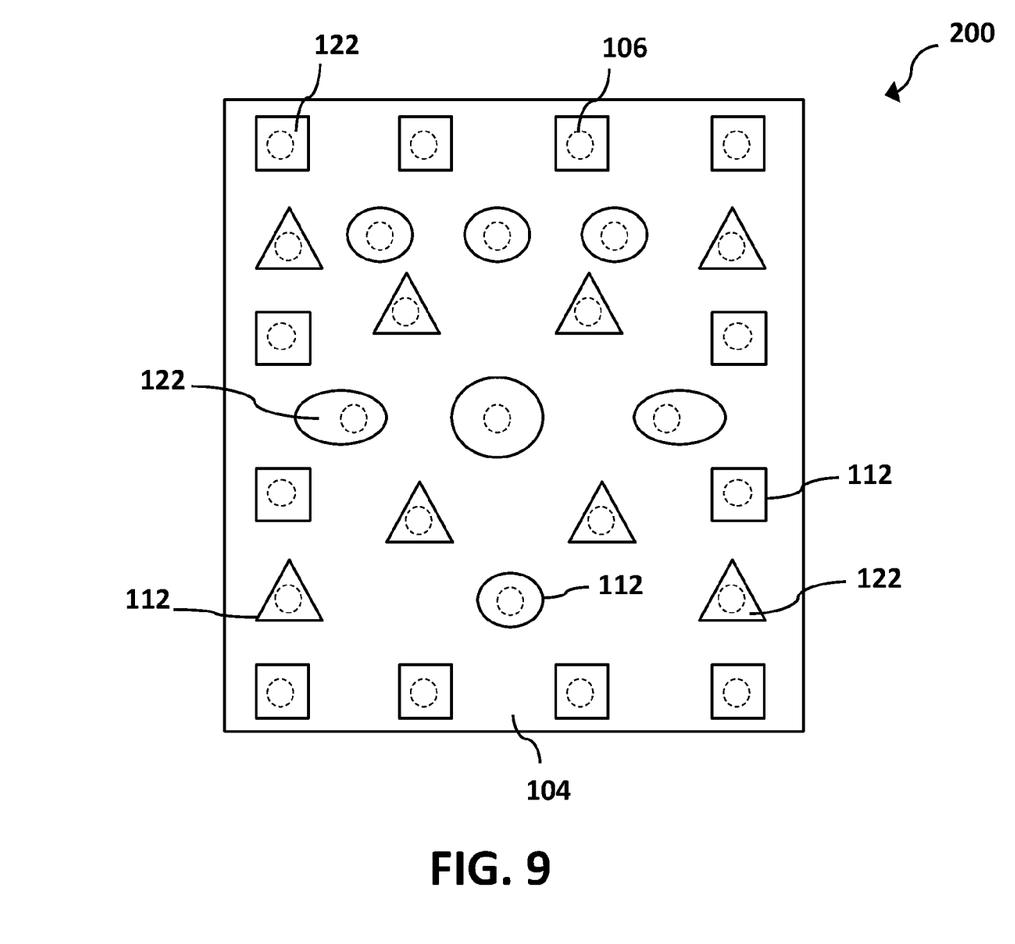
FIG. 9 depicts a top plan view of a C4 structure according to various embodiments of the invention.
Figure 10:
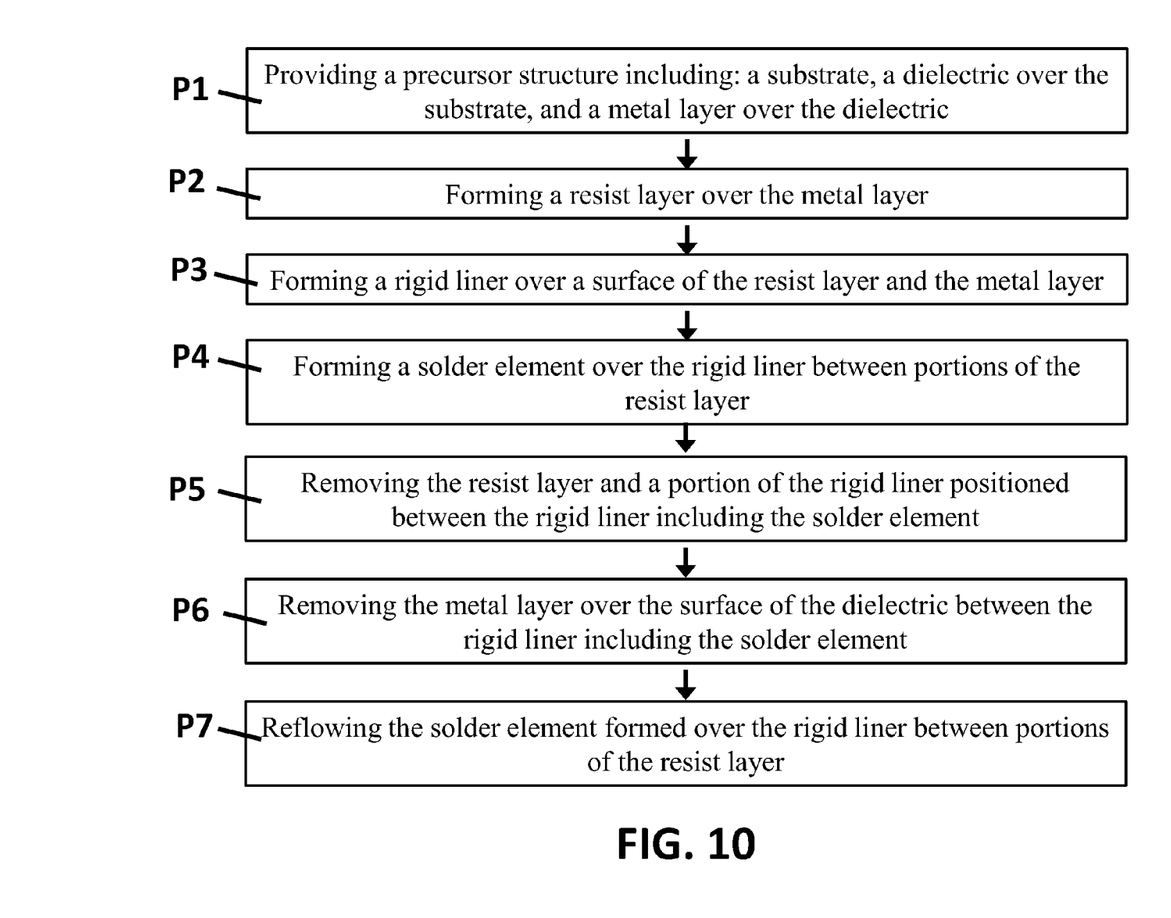
FIG. 10 depicts a flow diagram illustrating processes according to various embodiments of the invention.

Turning to FIG. 9, a top plan view of C4 structure 200 according to various embodiments of the invention is provided. In an embodiment, as shown in FIG. 10, C4 structure 200 may include a plurality of rigid liners 112 having unique and distinct shapes. More specifically, rigid liner 112 may provide a variety of molds for solder element 122, such that solder element 122 may substantially take the shape of a square, circle, triangle, etc. Furthermore, C4 structure 200 created by the process as discussed with respect to FIGS. 1-7 may allow for solder element 122 to be arranged in unique configurations. More specifically, rigid liners 112 including solder element 122 may provide a variety of non-conventional configurations for C4 structure 200. Rigid liner 112 acting as a mold for solder element 122 may substantially prevent defective solder contacts (e.g., solder bumps), by only allowing the solder element 122 to expand to form contact tip 124, and not expand outward to form inconsistent spherical solder bumps. This allows for non-conventional (e.g., non-uniform) configurations of the solder element 122 of the C4 structure 200. In an alternative embodiment, C4 structure 200 may provide a plurality of rigid liners 112 have a substantially similar shape, arranged in a non-conventional configuration.

FIG. 11 is a method flow diagram illustrating processes according to various aspects of the invention. As shown, one method can include the following processes:

Process P1: Providing a precursor structure including: a substrate, a dielectric over the substrate and a metal layer over the dielectric layer;

Process P2: Forming a resist layer over the metal layer;

Process P3: Forming a rigid liner over a surface of the resist layer and the metal layer;

Process P4: Forming a solder element over the rigid liner between portions of the resist layer;

Process P5: Removing the resist layer and a portion of the rigid liner positioned between the rigid liner including the solder element;

Process P6: Removing the metal layer over the surface of the dielectric between the rigid liner including the solder element; and Process P7: Reflowing the solder element formed over the rigid liner between portions of the resist layer.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of forming a controlled collapse chip connection (C4) structure, the method comprising:
    providing a precursor structure including:
        a substrate;
        a dielectric over the substrate, the dielectric including a plurality of trenches exposing a portion of the substrate; and
        a metal layer over the dielectric and the portion of the substrate in each of the plurality of trenches;
    forming a resist layer over the metal layer;
    forming a rigid liner over a surface of the resist layer and the metal layer;
    forming solder element over the rigid liner between portions of the resist layer;
    removing the resist layer and a portion of the rigid liner positioned between the rigid liner including the solder element;
    removing the metal layer over the surface of the dielectric between the rigid liner including the solder element; and
    reflowing the solder element formed over the rigid liner between portions of the resist layer.

2. The method of claim 1, wherein the forming of the resist layer includes selectively forming the resist layer over only a portion of the metal layer overlying the dielectric layer, exclusive of the metal layer in the plurality of trenches.

3. The method of claim 1, wherein the forming of the resist layer includes:
    blanket depositing the resist layer over the metal layer overlying the dielectric layer;
    masking the resist layer to expose a portion of the resist layer blanketly deposited over the metal layer; and
    removing the exposed portion of the resist layer.

4. The method of claim 1, wherein the forming of the rigid liner includes:
    forming a plurality of openings within portions of the rigid liner between portions of the resist layer, the plurality of openings aligned with the plurality of trenches.

5. The method of claim 4, wherein each of the plurality of openings include a distinct shape.

6. The method of claim 1, wherein the forming of the rigid liner includes forming the rigid liner over the metal layer within the plurality of trenches.

7. The method of claim 1, wherein the forming of the rigid liner further includes:
    depositing a dry film adhesive resist layer over the surface of the resist layer and the metal layer; and
    depositing a outer liner layer over the dry film adhesive resist layer using plasma vapor deposition.

8. The method of claim 1, wherein the rigid liner has a melting temperature greater than a melting temperature of the solder.

9. The method of claim 8, wherein the rigid liner includes one of nickel (Ni), tungsten (W), titanium tungsten (TiW), or tantalum nitride (TaN).

10. A method of forming a controlled collapse chip connection (C4) structure, the method comprising:
    providing a precursor structure including:
        a substrate;
        a dielectric over the substrate, the dielectric including a plurality of trenches exposing a portion of the substrate; and
        a metal layer over the dielectric and the portion of the substrate in the plurality of trenches;
    forming a resist layer over the metal layer;
    etching the resist layer to form a plurality of openings in the resist layer, the plurality of openings aligned with the plurality of trenches;
    forming a rigid liner within the plurality of openings in the etched resist layer;
    depositing a solder over the rigid liner formed within the plurality of openings in the etched resist layer;
    removing the resist layer;
    removing the metal layer over the surface of the dielectric between the rigid liner including the solder; and
    reflowing the solder deposited over the rigid liner.

11. The method of claim 10, wherein each of the plurality of openings include a distinct shape.

12. A method of forming a controlled collapse chip connection (C4) structure, the method comprising:
    providing a precursor structure including:
        a substrate;
        a dielectric over the substrate, the dielectric including a plurality of trenches exposing a portion of the substrate; and
        a metal layer over the dielectric and the portion of the substrate in each of the plurality trenches;
    forming a resist layer over the metal layer;
    forming a rigid liner over a surface of the resist layer and the metal layer;
    forming a solder element over the rigid liner between portions of the resist layer;
    removing the resist layer and a portion of the rigid liner positioned between the rigid liner including the solder element;
    removing the metal layer over the surface of the dielectric between the rigid liner including the solder element; and
    reflowing the solder element formed over the rigid liner between portions of the resist layer,
    wherein the rigid liner has a melting temperature greater than a melting temperature of the solder element.

13. The method of claim 12, wherein a shape of the rigid liner is substantially unaffected by heat from the reflowing of the solder element.

* * * * *